(12) United States Patent
Gonano et al.

(10) Patent No.: US 8,483,984 B2
(45) Date of Patent: Jul. 9, 2013

(54) METHOD AND APPARATUS FOR TESTING THE OPERATING CONDITIONS OF AN ELECTRIC NETWORK

(75) Inventors: Giovanni Gonano, Padua (IT); Pietro Mario Adduci, Settimo Milanese (IT); Edoardo Botti, Vigevano (IT)

(73) Assignee: STMicroelectronics S.r.l., Agrate Brianza (IT)

( * ) Notice: Subject to any disclaimer, the term of this patent is extended or adjusted under 35 U.S.C. 154(b) by 558 days.

(21) Appl. No.: 12/389,173

(22) Filed: Feb. 19, 2009

(65) Prior Publication Data
US 2009/0222227 A1  Sep. 3, 2009

(30) Foreign Application Priority Data

Feb. 21, 2008 (EP) .................................. 08425103

(51) Int. Cl.
*G01R 27/00* (2006.01)
(52) U.S. Cl.
USPC ............ 702/65; 702/57; 702/64; 702/66; 702/124
(58) Field of Classification Search
USPC .............. 702/57, 64, 65, 66, 69, 117, 118, 702/124, 189, 190, 191, 199
See application file for complete search history.

(56) References Cited

U.S. PATENT DOCUMENTS

| | | | |
|---|---|---|---|
| 6,094,033 A * | 7/2000 | Ding et al. | 320/132 |
| 6,262,563 B1 * | 7/2001 | Champlin | 320/134 |
| 2002/0071568 A1 | 6/2002 | Shuttleworth | |
| 2003/0184931 A1 * | 10/2003 | Morris | 361/42 |
| 2005/0163326 A1 | 7/2005 | Heuer | |
| 2006/0126857 A1 | 6/2006 | Pavlov et al. | |
| 2009/0021187 A1 * | 1/2009 | Bhagat | 315/297 |

FOREIGN PATENT DOCUMENTS

GB        2021790 A    12/1979

\* cited by examiner

*Primary Examiner* — Michael Nghiem
*Assistant Examiner* — Paul D Lee
(74) *Attorney, Agent, or Firm* — Seed IP Law Group PLLC

(57) ABSTRACT

A method for testing the operating conditions of an electric network, including at least one operating state, including the steps of providing a voltage signal (v(t)) to a network load and measuring the instantaneous current signal (i(t)) circulating in the load, delaying the instantaneous current signal (i(t)) to generate an instantaneous current signal delayed ((i(t+τ)) by a predetermined amount of time (τ), the predetermined amount of time (τ) being a function of the operating state of said load, the method including the steps of calculating, within a predetermined measurement time (Tm), an admittance ratio ($G_x(\tau)$) between the mean of the product of the voltage signal (v(t)) and the delayed instantaneous current signal (i(t+τ)), and the mean of the square of the voltage signal (v(t)), and to compare the value of the admittance ratio ($G_x(\tau)$) with a range of predetermined values (Gmin,Gmax) to determine the operating state of the electric network.

31 Claims, 7 Drawing Sheets

METHOD AND APPARATUS FOR TESTING THE OPERATING CONDITIONS OF AN ELECTRIC NETWORK

BACKGROUND

1. Technical Field

The present disclosure relates to a method and apparatus for testing the operating conditions of an electric network and, more particularly but without limitation, the operating conditions of a load of an electric network using changes in impedance or admittance.

2. Description of the Related Art

As used hereinafter, the term "operating conditions" is intended to relate not only to the operating condition of a load, but also to the condition in which some load components are short circuited or the condition in which some load components are open circuited.

Shorted or open operating states are known to occur in an electric network, e.g. when connections are established between two points of the circuit that impose a zero voltage at its ends, or when one of the circuit components is disconnected respectively.

In prior designs, the operating state of an electric network is tested by providing a voltage (or current) test signal to the load of the electric network, measuring the instantaneous current signal circulating in the load (or measuring the voltage at the ends of the load) and checking if the measured current (or voltage) value falls within a range of preset values, typically provided by the manufacturer.

If the measured current value is higher than the preset value, then the operating state of the electric network is deemed to be in a shorted condition, whereas if the measured current value is lower than the preset value, then the operating state of the electric network is deemed to be in an open condition.

Electric networks are also known to be affected by noise, which is defined as the totality of all undesired voltage or current signals overlapping the useful signal. In the above prior testing arrangements, such noise is a frequent source of errors, susceptible of causing inaccurate detection of the operating conditions of the electric network being tested.

In an attempt to reduce the risk of wrong detection caused by inaccurate measurement due to noise overlapping the useful signal, certain prior testing methods have used noise type-specific detection. For instance, the measuring step is designed to be repeated several times for the result to only be deemed valid when determined as such at all detections. Otherwise, the measuring test is deemed to be valid if the measured value remains stable for a predetermined time.

Further details about a practical example in which the operating conditions of the load are tested against actually expected conditions are illustrated in FIG. 1, which shows an audio amplifier 1 having an electric network 2 connected thereto, the latter including a two-way loudspeaker system composed of a woofer 2A and a tweeter 2B. The woofer 2A is connected to the amplifier 1 via an inductor 3, which acts as a low-pass filter, whereas the tweeter 2B is connected to the amplifier 1 via a high-pass filter, i.e., a capacitor 4. According to the prior design, voltage v(t) and current i(t) values flowing into the load 2 can be measured and stored for a given measurement time Tm.

In the circuit of FIG. 1, possible abnormal operating states to be detected include, without limitation:
  open condition of the woofer 2A;
  shorted condition of the woofer 2A;
  open condition of the tweeter 2B; and
  shorted condition of the tweeter 2B.

Still according to the prior design, in order to determine whether the woofer 2A or the tweeter 2B or both are in short circuit and/or open circuit conditions, a comparison step is carried out using preset value ranges provided by the manufacturer of the electric network. Bearing in mind, for example, that when the impedance of the woofer 2A has to be measured, the test signal used for testing is generally applied to the electric network 2 in the form of a voltage (or current) slowly varying within a time interval much longer than its resonance frequency period. In the presence of noise also, such as a mechanical stress, an EMF is generated, which is typically a damped oscillation at the resonance frequency with an average value that can be considered zero.

FIG. 2 shows the curve of current i(t) in the electric network 2 of FIG. 1 when such mechanical stress EMF is introduced. It can be seen that the voltage v(t) (which is represented by a voltage step) imposed on the electric network 2 is added with a damped oscillation associated with the mechanical stress EMF.

In prior testing methods, the operating condition of the electric circuit is evaluated considering current amplitude i(t) only. Particularly, in the case of a DC load (woofer), the current level i(t) is checked to determine whether it falls between the specification limits indicated by the lines Ith (min) and Ith(max) as shown in FIG. 2. If the measured current value i(t) exceeds the threshold Ith(max), then the load L represented by the electric network 2 is deemed to be a short circuit. However, if the measured current value i(t) is below the threshold Ith(min), then the load represented by the electric network 2 is deemed to be an open circuit.

In order to reduce the risk of false detections caused by the current noise introduced by the mechanical stress EFM, either of the following actions may be taken:
  the measuring step is repeated N times, and the result is only deemed valid when determined as such at all detections, or
  the result of the measuring step is deemed valid if it is maintained throughout the measurement time Tm (e.g., 200 msec in the case of a woofer). Otherwise, the test is deemed to be invalid.

Referring now to FIGS. 3A to 3C, waveforms are shown in which the current signal i(t) circulating in the tweeter 2B (FIG. 3A) at a 20 kH frequency is added with a noise signal n(t) (FIG. 3B) generated by an electromagnetic field or by the amplifier 1 itself. In the case of the electric network 2 of FIG. 1, prior testing includes determination of the operating condition by considering the number of above threshold occurrences of the measurement signal i(t) with the noise superposed thereto, with respect to a predetermined threshold H in a predetermined time Tm (FIG. 3C).

If the above-threshold H occurrences of the current i(t) in the measurement time Tm are greater than a predetermined number N of above-threshold occurrences, the load L is deemed to be present, whereas if such threshold H is never exceeded, the load L is deemed to be an open circuit. Also, if the number of above-threshold occurrences is greater than zero but smaller than N, the test is deemed to be invalid.

It shall be noted that the above testing embodiments relate to AC powered loads, and can only concern the tweeter 2B of the electric network 2. It shall be also noted that the shorted or open conditions as detected above do not cause considerable percentage changes in the equivalent modulus of impedance at the ends of the load provided by the electric network 2.

Particularly, with further reference to FIG. 4, it can be seen that, at 20 kH frequency, there is very little difference between the equivalent modulus of impedance of the electric network 2 in normal conditions and the modulus of impedance of the same electric network 2 when, for example, the tweeter 2B is shorted, which difference cannot be discriminated (see point indicated by the arrow in FIG. 4).

However, in FIG. 5, the modulus of impedance of the cases described above with reference to FIG. 4 exhibits an important phase difference, particularly 90 degrees (see point indicated by the arrow). Also, it can be seen from FIG. 6 that, at 20 kH frequency, there is very little difference between the equivalent modulus of impedance of the electric network 2 in normal conditions and the modulus of impedance of the same electric network 2 when, for example, the tweeter 2B is disconnected (open condition), which difference cannot be discriminated (see point indicated by the arrow). However, in FIG. 7, the modulus of impedance of the cases described above with reference to FIG. 6 exhibits a 60 degree phase difference (see point indicated by the arrow).

In view of the above, the embodiments of the present disclosure overcome the above mentioned prior art drawbacks.

BRIEF SUMMARY

According to the present disclosure, a method and an apparatus for testing the operating conditions of an electric circuit is provided.

The present disclosure provides an effective testing method that can eliminate measurement errors in electric circuit testing while ensuring improved performance and quicker operation. Also, this operating condition testing method ensures high noise immunity, implementation simplicity and a wide range of application. The present disclosure further provides a method and an apparatus for more effective testing and more accurate determination of short- and open-circuits of an electric network as compared with simple comparisons of current and voltage signal amplitudes, due to the introduction of phase.

Furthermore, the embodiments described herein below provide for the detection of impedance (or admittance) changes caused by open or shorted conditions of the individual components of an electric network, the method being carried out by selective frequency and phase analysis. Also, the method and apparatus of the present disclosure can also use a general signal, which allows electric network impedance to be also monitored during operation of the electric system while preventing test signals from adding to the operating signal.

In accordance with another embodiment of the present disclosure, a method is described that includes providing a voltage signal to an electric network having at least one operating state, the electric network including at least one load; measuring the instantaneous current signal circulating in the load as a result of providing the voltage signal; generating a delayed instantaneous current signal that is delayed by a predetermined amount of time that is a function of an operating state of the load; calculating within a predetermined measurement time an impedance or admittance ratio; and comparing the value of the impedance or admittance ratio with a range of predetermined values to determine at least one operating state of the electric network.

In accordance with another aspect of the foregoing embodiment, calculating the impedance or admittance ratio includes calculating the impedance or admittance ratio between the mean of a product of the voltage signal and the delayed instantaneous current signal, and the mean of the square of the voltage signal.

In accordance with another aspect of the foregoing embodiment, if the operating condition of the electric network is a short-circuit operating state, the method includes the steps of delaying the instantaneous current signal by a predetermined amount of time equal to a first time value to generate a first delayed instantaneous current signal, calculating the impedance or admittance ratio based on the value of the first delayed instantaneous current value to generate a short-circuit impedance or admittance ratio, and comparing the short-circuit impedance or admittance ratio with a preset value; and if the operating condition is an open-circuit operating state, the step of calculating the impedance or admittance ratio includes the additional steps of delaying the instantaneous current signal by a predetermined amount of time equal to a second time value to generate a second delayed instantaneous current signal, calculating the impedance or admittance ratio based on the value of the second delayed instantaneous current value to generate an open-circuit impedance or admittance ratio, and comparing the open-circuit impedance or admittance ratio with a preset value.

In accordance with another embodiment of the present disclosure, a method for testing operating conditions of an electric network having at least one operating state and coupled to at least one load, the circuit including a first circuit adapted to generate a voltage signal to be provided to the load and measuring an instantaneous current signal circulating in the load as a result of the generating of the voltage signal; a selector circuit adapted to select a predetermined amount of time; a second circuit adapted to generate an instantaneous current signal that is delayed by the predetermined amount of time; a processor operating within a predetermined measurement time and adapted to process an impedance or admittance ratio; and a comparator adapted to compare the value of the impedance or admittance ratio with a range of predetermined values to determine the at least one operating state of the electric network.

In accordance with another aspect of the foregoing embodiment, the selector is adapted to select the predetermined amount of time as a function of the operating state to be tested of the electric network, and the second circuit is adapted to generate the instantaneous current signal by the predetermined amount of time as a function of the selected operating state by the selector.

In accordance with another aspect of the foregoing embodiment, the processor is configured to process the impedance or admittance ratio between the mean of the product of the voltage signal generated by the first circuit and the delayed instantaneous current signal generated by the second circuit and the mean of the square of the voltage signal generated by the first circuit.

BRIEF DESCRIPTION OF THE SEVERAL VIEWS OF THE DRAWINGS

The characteristics and advantages of the disclosed embodiments will appear from the following detailed description, which are illustrated without limitation in the annexed drawings, in which.

DETAILED DESCRIPTION

Figure 1:
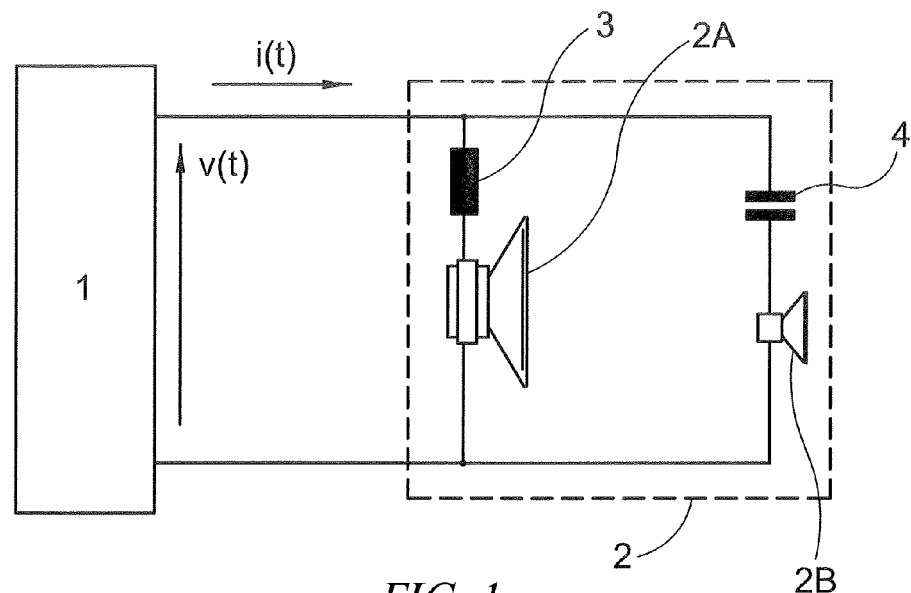
FIG. 1 shows a block diagram of a known electric network undergoing an operating state check.
Figure 2:
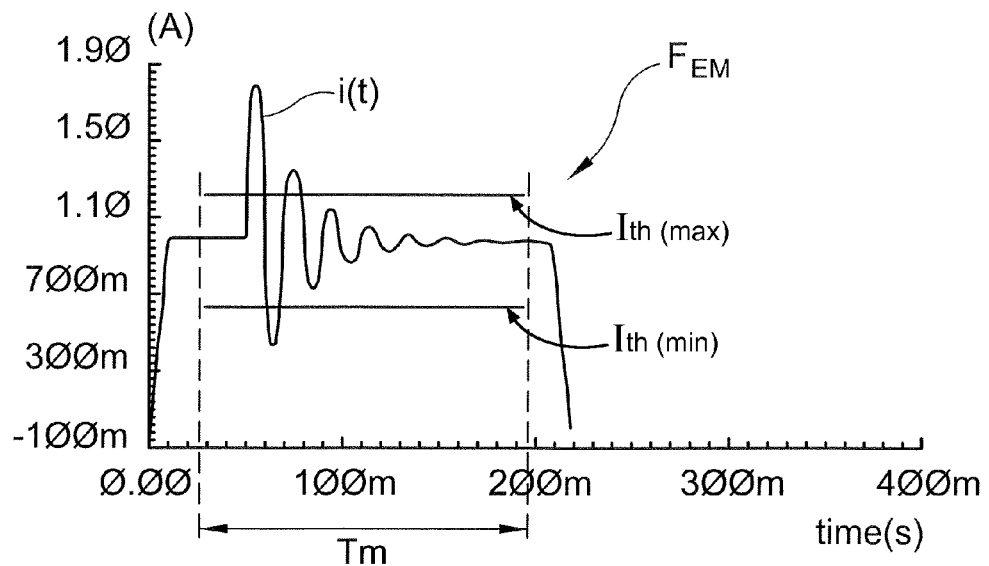
FIG. 2 shows a current curve when a mechanical stress is applied to the electric network load.
Figure 3A:
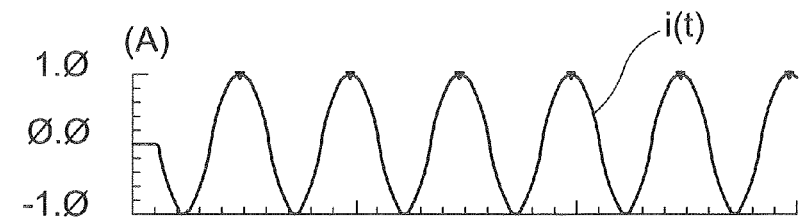
FIGS. 3A, 3B and 3C show the curves of the test signal, the noise, and the current when noise overlaps the test signal in the electric network load.
Figure 3B:
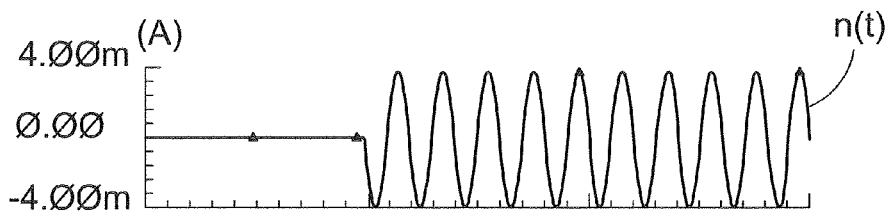
Figure 3C:
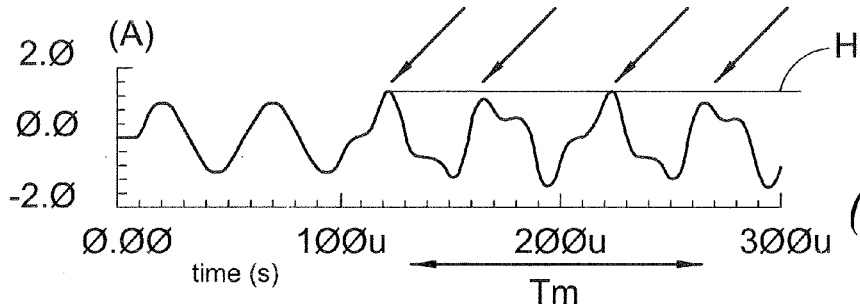
Figure 4:
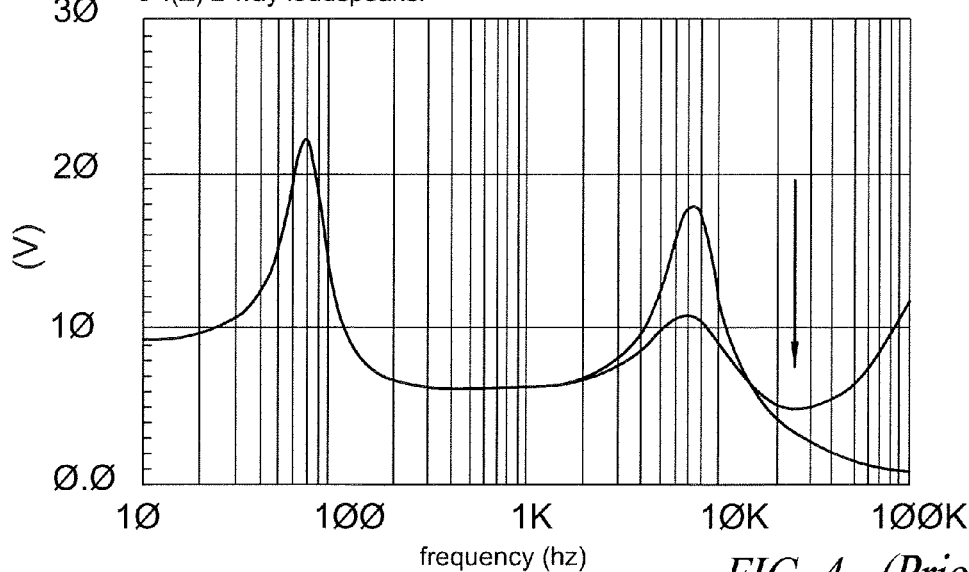
FIG. 4 shows the curves of the moduli of impedance of the electric network load in normal and shorted operating conditions respectively.
Figure 5:
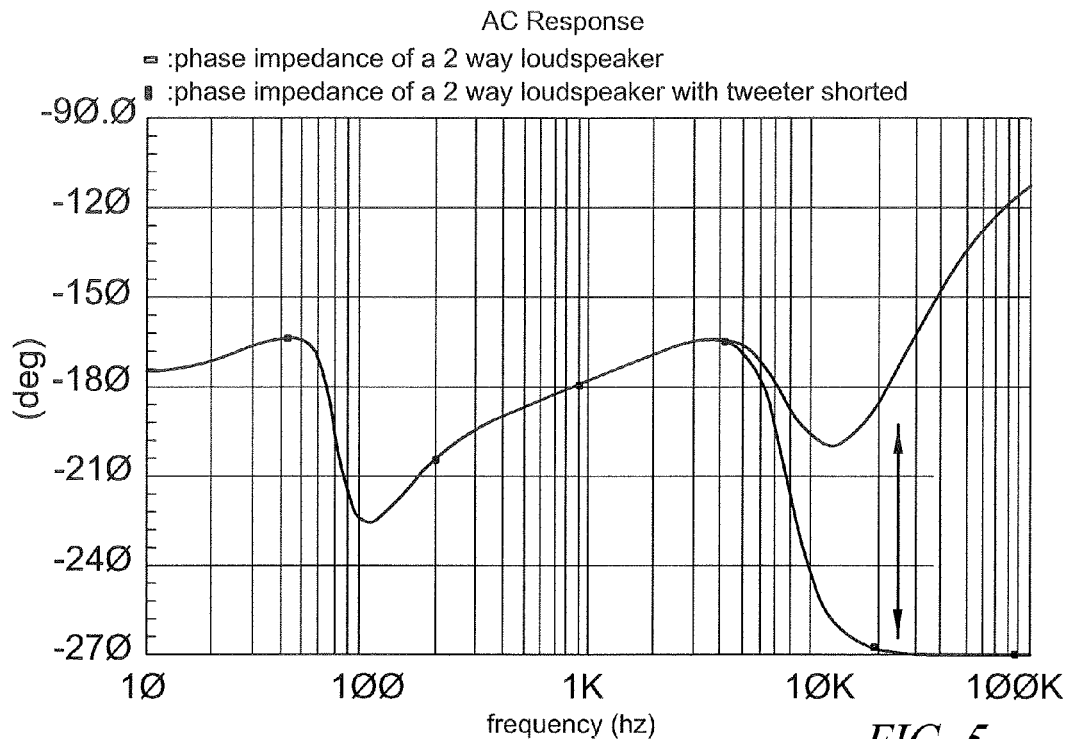
FIG. 5 shows the curves of phases of impedance of the electric network load in normal and shorted operating conditions respectively.
Figure 6:
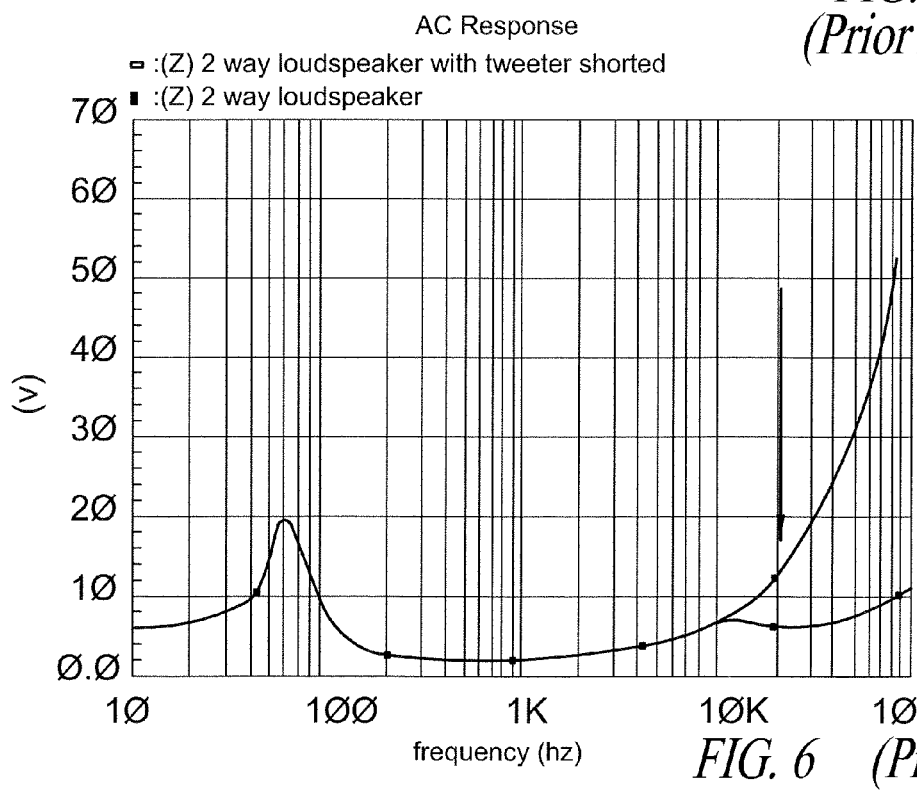
FIG. 6 shows the curves of the moduli of impedance of the electric network load in normal and open operating conditions respectively.
Figure 7:
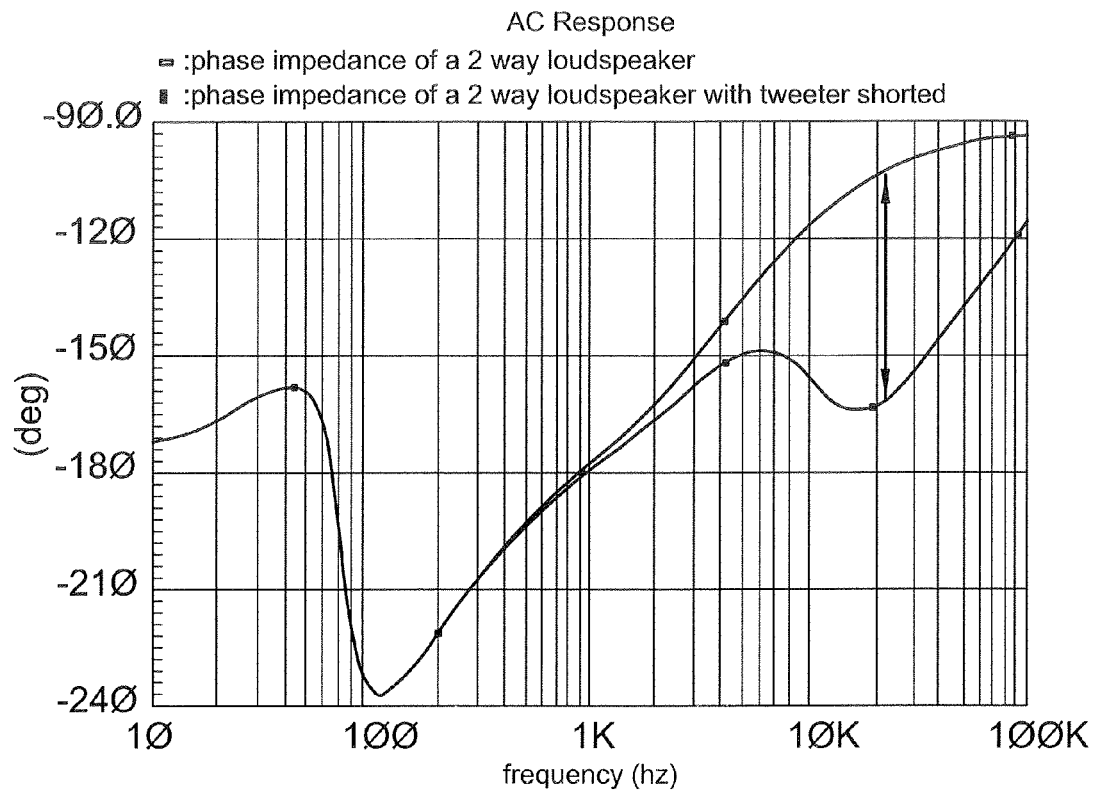
FIG. 7 shows the curves of phases of impedance of the electric network load in normal and open operating conditions respectively.
Figure 8:
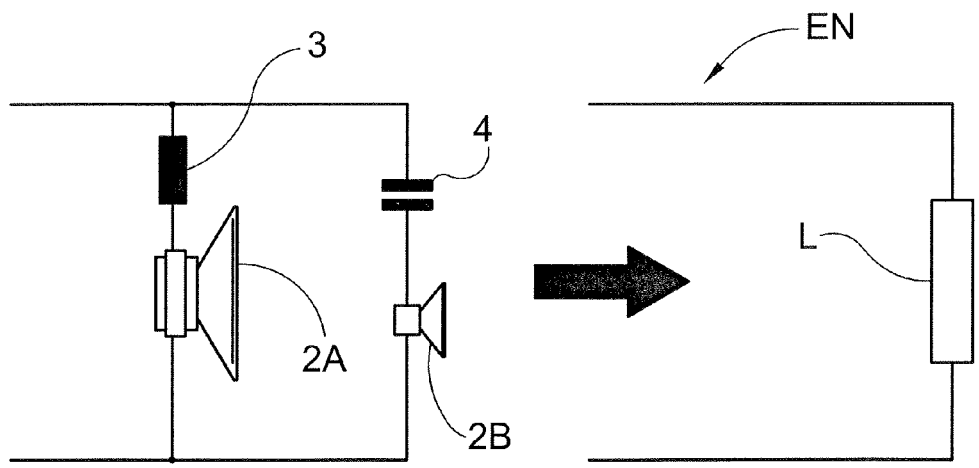
FIG. 8 is a schematic representation of a possible electric network to be tested for its operating state according to the present disclosure.
Figure 9A:
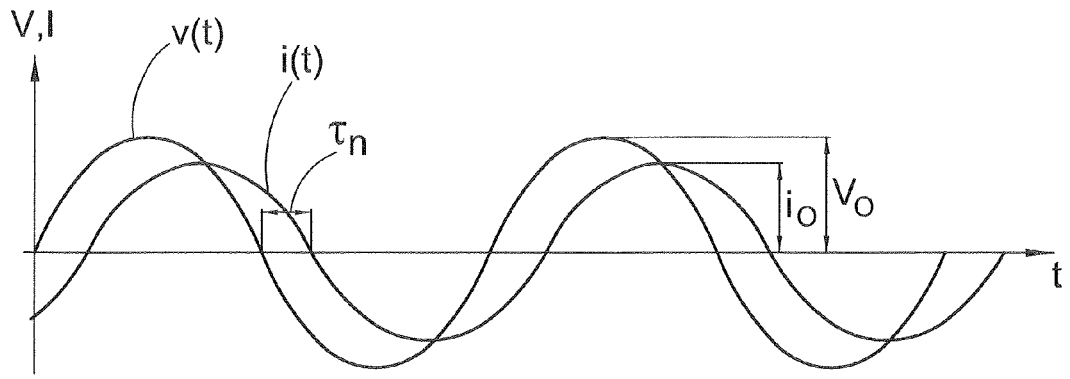
FIGS. 9A and 9B show respective curves of sinusoidal voltage and current as a function of time, and respective vector representations in the complex plane.
Figure 9B:
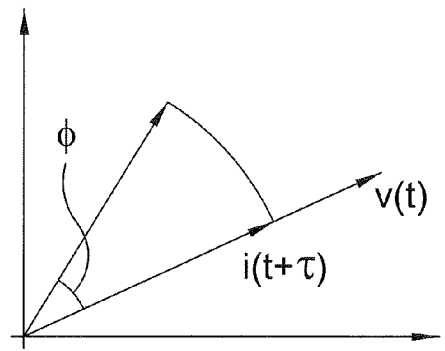

Referring to the annexed figures, and particularly to FIGS. 8, 9a and 9b, for ease of reference, like reference numbers are used for like components in FIG. 1. Assume impedance Z has to be measured at the terminals of the electric network EN. The electric network EN includes, for example, a load L of an amplifier.

In this specific example, the load L is embodied by the parallel connection of a series of the resistance of speaker 2A and the inductor 3 to the resistance of speaker 2B and the capacitor 4, i.e., is a load that can represent the circuit components of a two-way loudspeaker system typically for use in audio applications.

In order to determine the impedance value Z of the load L, a test signal, i.e., either a voltage v(t) or a current i(t) signal, has to be introduced in the electric network EN. The method for testing the operating condition of the electric network EN is described hereinbelow by way of example with reference to the case of a sinusoidal voltage test signal v(t). It shall be first noted that the method may be also used with non sinusoidal or general signals. Nevertheless, if general signals are used, it should be ensured that such signals have a sufficiently high spectral component in the specific frequency range in which the operating state of the load has to be checked.

For simplicity and clarity, the possible states of the load L at a certain frequency, as mentioned below, include:

state 1: normal load in which load impedance can be represented as follows:

$$Z_{norm}=|Z_n|\exp(i\phi_n),$$

state 2a: shorted conditions in which load impedance can be represented as follows:

$$Z_{short}=|Z_{sh}|\exp(i\phi_{sh}) \text{ where } |Z_{sh}|<=|Z_n|,$$

state 2b: open conditions in which load impedance can be represented as follows:

$$Z_{open}=|Z_{op}|\exp(i\phi_{op}) \text{ where } |Z_{op}|>=|Z_n|.$$

It is generally assumed that, by changing from state 1 to state 2a (or 2b), the load undergoes a phase or amplitude change or both, with the case in which the modulus of impedance is constant or only changes in phase is also provided.

The method for testing the operating conditions of the electric network EN includes the steps of:

providing a voltage test signal v(t) to a load L of the electric network EN and measuring the instantaneous current signal i(t) circulating in the load L of the electric network EN.

The steps of providing a voltage test signal v(t) and measuring the instantaneous current signal i(t) may be carried out, according to specific cases, either by testing at predetermined times or by continuous testing during operation of the load L.

If testing occurs at predetermined times, the operating state of the circuit in the desired frequency range is assumed to be stable during measurement (state 1, state 2a or state 2b). However, if testing occurs continuously, the operating state of the circuit can change with time from state 1 to state 2a or 2b as set out above. It shall be noted that such signals may be processed and calculated by suitable testing means, such as continuous or discrete time analog components (transducers, multiplier cells, analog integrators, etc.) or discrete time digital components (Digital Signal Processors).

As used hereinbelow and in the annexed claims, $\phi$ is intended to indicate the phase shift between the current signal i(t) and the voltage signal v(t). As a result, the delay (or advance) between the current signal i(t) and the voltage signal v(t) is defined as:

$$\tau=\phi/\omega.$$

FIGS. 9a and 9b show the sinusoidal current i(t) and voltage v(t) signals in the electric network EN and the phase shift $\phi_n$ between the current i(t) e voltage signals v(t) in normal load conditions.

In the most general case, the method of the disclosure includes the further steps of:

delaying the instantaneous current signal i(t) to generate an instantaneous current signal delayed i(t+τ) by a predetermined amount of time (τ), said predetermined amount of time (τ) being a function of the operating state of the load (L) to be tested, calculating, within a predetermined measurement time Tm, an admittance ratio $G_\chi(\tau)$ between:

the mean of the product of the voltage signal v(t) and the delayed instantaneous current signal i(t+τ), and the mean of the square of the voltage signal v(t), comparing the value of the admittance ratio $G_\chi(\tau)$ with a range of predetermined values $(G_{min},G_{max})$ and thence determine the operating state of the electric network EN.

It should be first noted that, once a general impedance Z and a frequency ν are set, the delay between the current i(t) and the voltage v(t) may be changed by a predetermined amount of time τ thereby allowing maximization or minimization of the admittance ratio $G_\chi(\tau)$ between the product of the voltage signal v(t) and the delayed instantaneous current signal i(t+τ), and the square of the voltage signal v(t).

Such comparison can be represented as follows:

$$G_{min} \int v(t)^2 dt \leq \int v(t) \cdot i(t+\tau) dt$$

$$G_{max} \int v(t)^2 dt \geq \int v(t) \cdot i(t+\tau) dt$$

In terms of implementation, this comparison is convenient in that it eliminates dividing calculations, which impose a burden on the computing device.

Figure 10:
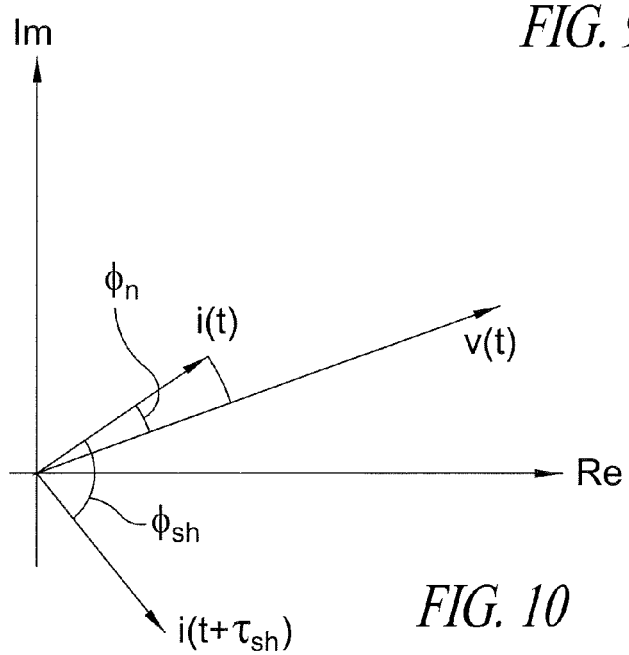
FIG. 10 shows a vector representation of the sinusoidal voltage and current for the electric network as shown in FIG. 8 when such electric network is in a normal operating condition.
Figure 11:
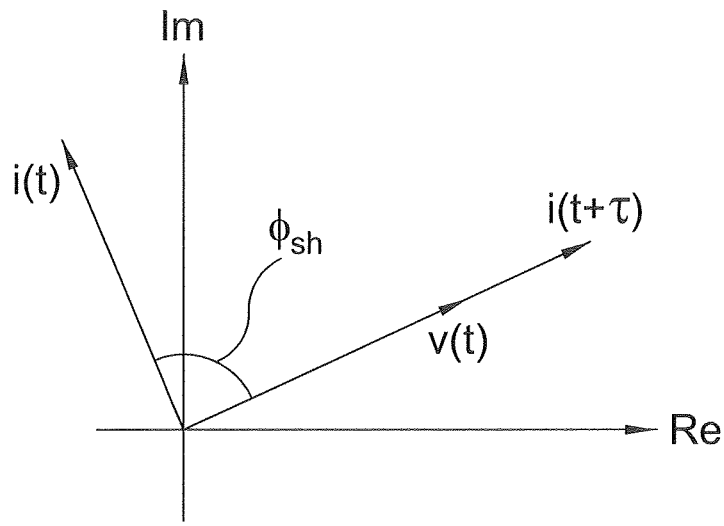
FIG. 11 shows a vector representation of the sinusoidal voltage and current for the electric network as shown in FIG. 8 when such electric network is in a shorted condition.

Referring to FIGS. 10 and 11, assume that the load L has to be checked for a short-circuit operating state (sc) defined above as "state 2a". FIGS. 10 and 11 show the sinusoidal current i(t) and voltage v(t) signals in the electric network EN and the phase shift $\phi_{sh}$ between said current i(t) e voltage signals v(t) in shorted conditions.

The method of the disclosure includes the additional steps of:
delaying the instantaneous current signal i(t) by a predetermined amount of time $\tau$ equal to a first time value $\tau_{sh}$ to generate a delayed instantaneous current signal i(t+$\tau$),
calculating the admittance ratio $G_\chi(\tau)$ based on the value of the first delayed instantaneous current value i(t+$\tau_{sh}$) to generate a short-circuit admittance ratio $G_\chi(\tau_{sh})$,
comparing the short-circuit admittance ratio $G_\chi(\tau_{sh})$ with the preset value $G_{max}$.

For a better understanding of the operation and characteristics of the method of the present disclosure if the operating condition of the load L is in a shorted operating circuit (sc), the changes of measured and calculated parameters between the operating state 1 (load L in normal operating conditions) and the operating state 2a (load L in shorted operating conditions (sc)) will be now detailed.

As voltage v(t) remains constant in modulus and phase in both states, current i(t) increases in modulus and its phase shift with respect to voltage changes from $\phi_n$ to $\phi_{sh}$, i.e., the advance of current i(t) with respect to voltage v(t) changes from $\tau_n$ to $\tau_{sh}$. The first delayed instantaneous current signal i(t+$\tau_{sh}$) in normal conditions is delayed by $\tau_n$-$\tau_{sh}$ whereas it will be perfectly in phase with the voltage signal v(t) under shorted conditions. Therefore, the product of the first delayed instantaneous current signal i(t+$\tau_{sh}$) and the voltage signal v(t) increases in modulus not only because the modulus of i(t) increases but also because i(t+$\tau_{sh}$) tends to align with v(t).

If the load L has to be checked for short circuits, a short-circuit admittance ratio $G_\chi(\tau_{sh})$ will be compared with the predetermined value $G_{max}$. If this value exceeds $G_{max}$, a short-circuit condition will be ascertained. In other words, for the load L to be checked for a short-circuit condition, the sinusoidal voltage v(t) is applied to the load L and the current i(t) is measured by calculating the admittance ratio $G_\chi(\tau)$ for a delay $\tau_{sh}=\phi_{sh}/\omega$.

While in nominal operating conditions (operating state (1)), the phase shift generates a short-circuit admittance ratio $G_\chi(\tau_{sh})$ lower than the modulus of nominal admittance (with the vectors i(t+$\tau_{sh}$) and v(t) misaligned). As the operating state changes to short-circuit (or operating state (2a)), the phase shift between voltage and current will tend to −$\phi_{sh}$, thereby facilitating effective convergence of the short-circuit admittance ratio $G_\chi(\tau_{sh})$ with the value in the short-circuit state.

In normal operating conditions, the admittance ratio $G_\chi(\tau)$ is:

$$G_\chi(\tau)=(1/|Z_{norm}|)*Cos(\phi_n-\phi_{sh}),$$

whereas, in shorted conditions, the admittance ratio $G_\chi(\tau_{sh})$ is:

$$G_\chi(\tau_{sh})=1/|Z_{short}|.$$

$G_\chi(\tau_{sh})$ has to be compared with the threshold $G_{max}$ which is conveniently set between the maximum obtainable value for $G_\chi(\tau)=(1/|Z_{norm}|)*Cos(\phi_n-\phi_{sh})$ and the minimum value of $G_\chi(\tau_{sh})=1/|Z_{short}|$ based on the range of preset values as provided by the datasheet for a load of the type of FIG. 8.

Figure 12:
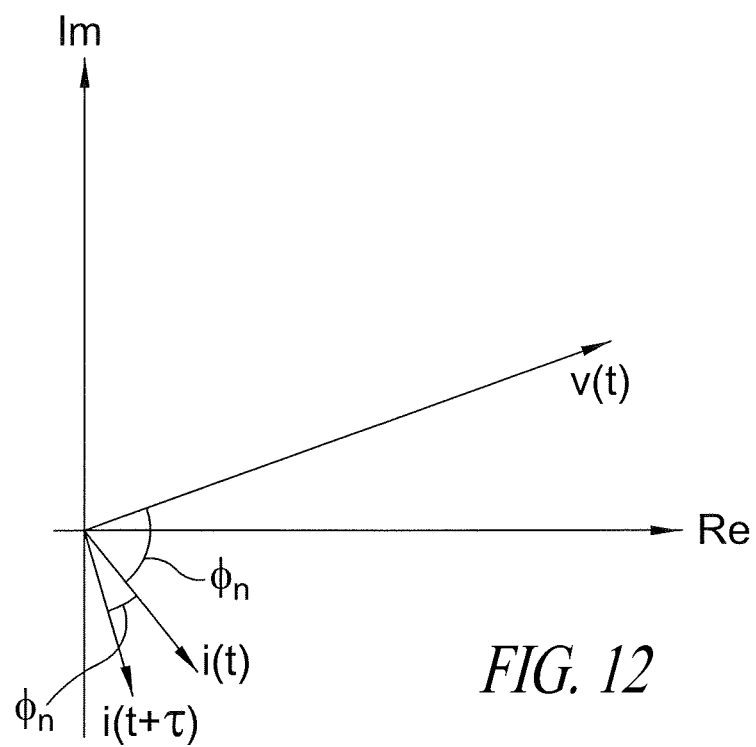
FIG. 12 shows a vector representation of the sinusoidal voltage and current for the electric network as shown in FIG. 8 when such electric network is in an open condition.

Referring to FIG. 12, assume that the load L has to be checked for an open-circuit operating state (oc), defined above as "state 2b".

The method of the disclosure includes the additional steps of:
delaying the instantaneous current signal i(t) by a predetermined amount of time $\tau$ equal to a second time value $\tau_n$ to generate a delayed instantaneous current signal i(t+$\tau_n$),
calculating the admittance ratio $G_\chi(\tau)$ based on the value of the second delayed instantaneous current value i(t+$\tau_n$) to generate an open-circuit admittance ratio $G_\chi(\tau_n)$, and
comparing the open-circuit admittance ratio $G_\chi(\tau_n)$ with the preset value $G_{min}$.

For a better understanding of the operation and characteristics of the method of the present disclosure, if the operating condition of the load L is in an open operating state (oc), the changes of measured and calculated parameters between the operating state 1 (load L in normal operating conditions) and the operating state 2b (load L in open operating conditions (oc)) will be now detailed.

As the applied voltage v(t) remains constant in modulus and phase, current i(t) decreases in modulus and its phase shift with respect to voltage changes from $\phi_n$ to $\phi_{op}$, i.e., the advance of current i(t) with respect to voltage changes from $\tau_n$ to $\tau_{op}$.

The second delayed instantaneous current signal i(t+$\tau_n$), obtained with a predetermined delay value $\tau_n$, in normal conditions is in phase with voltage and in open conditions is phase-shifted by $\tau_n$-$\tau_{op}$. The product of the second delayed instantaneous current signal i(t+$\tau_n$) and the voltage signal v(t) decreases in modulus not only because the modulus of i(t) decreases but also because i(t+$\tau$n) tends to disalign with v(t).

When the presence of open circuits has to be checked, an open-circuit admittance ratio $G_\chi(\tau_{sh})$ will be obtained, to be compared with the predetermined value $G_{min}$. If such value is lower than $G_{min}$, then an open condition will occur.

For the electric network EN to be checked for open circuits, the value $G_\chi(\tau_n)$ is determined for $\tau=\tau_n$.

In normal operating conditions, the admittance ratio $G_\chi(\tau)$ is:

$$G_\chi(\tau)=(1/|Z_{norm}|),$$

whereas, in shorted conditions, the open circuit admittance ratio $G_\chi(\tau_n)$ is:

$$G_\chi(\tau_n)=1/|Z_{open}|*Cos(\phi_{op}-\phi_n).$$

Therefore, $G_\chi(\tau_n)$ has to be compared with the threshold $G_{min}$ which is conveniently set between the minimum obtainable value for $G_\chi(\tau)=(1/|Z_{norm}|)$ and the maximum value of $G_\chi(\tau_n)=1/|Z_{open}|*Cos(\phi_{op}-\phi_n)$ based on the range of preset values as provided by the datasheet for a load of the type of FIG. 8.

When the circuit tends to change to open conditions, as described with reference to FIG. 12, then:
the current i(t) has decreased in modulus exactly as much as the modulus of the admittance ratio $G_\chi(\tau)$, and
the voltage signal v(t) and the second delayed instantaneous current signal i(t+$\tau_n$) are further phase-shifted by $\phi_{op}$ and thence the vectors in the complex plane tend to misalign as the phase between current i(t) and voltage v(t) changes with respect to the nominal value.

It shall be noted that the electric network EN is in normal operating conditions if it simultaneously fulfils the following inequalities:

$$G_{min} < G_\chi(\tau_{sh})$$

$$G_{max} > G_\chi(\tau_n).$$

As described heretofore, the actual operating state of the load L of the electric network EN can be only determined by calculating the admittance ratio $G_\chi(\tau)$, which in turn depends on the predetermined amount of phase shift $\tau$.

The values $\tau_{sh} = \phi_{sh}/\omega$ and $\tau_n = \phi_n/\omega$ can be deduced from the predetermined values typically provided by the datasheet of the manufacturers of the electric network EN and $\upsilon$ is the average frequency value within the band of interest in which the state of the load is to be determined. In the audio application of tweeter testing, the test signal can be a sinusoid, typically at a 20 KHz frequency.

It shall be noted that, to determine the admittance ratio $G_\chi(\tau)$, if the voltage signal v(t) and the instantaneous current signal i(t) are analog signals, then the admittance ratio $G_\chi(\tau)$, the short-circuit admittance ratio $G_\chi(\tau_{sh})$, and the open-circuit admittance ratio $G_\chi(\tau_n)$ are determined using the following relations:

$$G_\chi(\tau) = \frac{\int_{Tm} v(t) \cdot i(t+\tau) dt}{\int_{Tm} v(t)^2 dt}$$

$$G_\chi(\tau_{sh}) = \frac{\int_{Tm} v(t) \cdot i(t+\tau_{sh}) dt}{\int_{Tm} v(t)^2 dt}$$

$$G_\chi(\tau_n) = \frac{\int_{Tm} v(t) \cdot i(t+\tau_n) dt}{\int_{Tm} v(t)^2 dt}$$

where v(t) is the voltage signal, $i(t+\tau)$ is the current signal delayed by the predetermined amount of time $\tau$, $i(t+\tau_{sh})$ is the current signal delayed by the predetermined amount of time $\tau_{sh}$, $i(t+\tau_n)$ is the current signal delayed by the predetermined amount of time $\tau_n$, and Tm is the preset measurement time.

However, if the voltage signal v(t) and the instantaneous current signal i(t) are sampled discrete signals, then the admittance ratio $G_\chi(\tau)$ comprises the calculation of a digital admittance ratio ($G_\chi(k)$), a short-circuit digital admittance ratio ($G_\chi(k_{sh})$), and an open-circuit digital admittance ratio ($G_\chi(k_n)$) using the following relations:

$$G_\chi(k) = \frac{\sum_m^N v_m \cdot i_{m+k}}{\sum_m^N v_m^2}$$

$$G_\chi(k_{sh}) = \frac{\sum_m^N v_m \cdot i_{m+ksh}}{\sum_m^N v_m^2}$$

$$G_\chi(k_n) = \frac{\sum_m^N v_m \cdot i_{m+kn}}{\sum_m^N v_m^2}$$

where $v_m$ is the $m^{th}$ sample of the digital voltage signal, k, $k_{sh}$, $k_n$ are the numbers of samples whereby the current signal $i_m$ is to be delayed, $i_{m+k}$ is the $m^{th}$ sample of the digital instantaneous current signal delayed by the predetermined amount of sampling $k_n$, $i_{m+ksh}$ is the $m^{th}$ sample of the first digital instantaneous current signal delayed by the first predetermined sampling amount $k_{sh}$, $i_{m+kn}$ is the $m^{th}$ sample of the digital instantaneous current signal delayed by the second predetermined amount of sampling $k_n$, and N are the values sampled within the preset measurement time (Tm).

The quantity k corresponds to the number of samples whereby the current signal $i_{m+k}$ is to be delayed. Particularly, with reference to the time $\tau$ as defined above k is defined as:

$$k = \left\lfloor \frac{\tau}{\Delta t} \right\rfloor$$

where $\Delta t$ is the sampling period, i.e., Tm/N.

As previously described, testing operations on the electric network EN may be affected by the presence of noise, which may be either current or voltage noise, and adds to the measured signal.

Without prejudice to the general scope of the disclosure, assume a voltage signal v(t) is transmitted and the current i(t) is measured. The measured current i(t) will be the sum of the signal $i(t)_{real}$, i.e., the current real value and a general noise signal $i(t)_{noise}$, i.e., $i(t) = i(t)_{real} + i(t)_{noise}$.

The effect of the admittance relationship $G_\chi(\tau)$ will be as follows:

$$G_\chi(\tau) = \frac{\int_{Tm} v(t) \cdot [i_{real}(t+\tau) + i_{noise}(t+\tau)] dt}{\int_{Tm} v^2(t) dt}$$

The linearity of the averaging operation (i.e., integration in the continuous case and summation in the discrete case) ensures that the admittance ratio $G_\chi(\tau)$ is:

$$G_\chi(\tau) = \frac{\int_{Tm} v(t) \cdot i_{real}(t+\tau) dt}{\int_{Tm} v^2(t) dt} + \frac{\int_{Tm} v(t) \cdot i_{noise}(t+\tau) dt}{\int_{Tm} v^2(t) dt}$$

where v(t) is the voltage signal, $i_{real}(t+\tau)$ is the real value of the current signal i(t) delayed by a predetermined time $\tau$, Tm is the predetermined measurement time, and $i_{noise}(t+\tau)$ is a current noise signal within the electric network EN.

The method of the disclosure ensures that the integral in the numerator of the last member tends to zero over a rather extended time interval Tm.

Furthermore, the division by the integral of $v^2(t)$ causes the last member of the above expression to tend more quickly to zero over an appropriate integration window Tm, unlike the first term, in which the numerator and the denominator increase at the same rate, tending to the expected value.

In the discrete case, the effect of noise defines a digital admittance ratio $G_\chi(k)$ as follows:

$$G_\chi(k) = \frac{\sum_m^N v_m \cdot [i_{real_{m+k}} + i_{noise_{m+k}}]}{\sum_m^N v_m^2}$$

which, as mentioned above, may be rewritten as follows:

$$G_\chi(k) = \frac{\sum_m^N v_m \cdot i_{real_{m+k}}}{\sum_m^N v_m^2} + \frac{\sum_m^N v_m \cdot i_{noise_{m+k}}}{\sum_m^N v_m^2}$$

where $v_m$ is the $m^{th}$ sample of the digital voltage signal, $i_{real\_m+k}$ is the $m^{th}$ sample of the digital current real signal $i_{m+k}$ delayed by a predetermined amount k, N are the values sampled within the preset measurement time Tm, and $i_{noise\_m+k}$ is the $m^{th}$ sample of the digital current noise signal within the electric network EN.

The integration window Tm (i.e., the number N of samples) determines the signal-to-noise ratio of measurement and the size of the integrating filter (digital registers in the discrete case) to be used, and it has to be selected according to the desired signal-to-noise ratio and to the frequency of the sinusoidal signal being transmitted or to the band thereof in the case of general signals.

Noise immunity may be enhanced by selective filtering of the generated/detected voltage and current signals, by only requiring the filter transferring function to be the same for voltage and current.

Such filter transferring function appears both in the numerator and denominator and is thus cancelled. In practice, it is as if the applied stress were filtered out before reaching the load.

Generally, if the network has a resonance frequency, an attenuation is conveniently applied at the resonance frequency because, when noise occurs due to undesired pulsed perturbation, the noise spectrum will be predominant at such frequencies. In the case of direct current DC, noise immunity is simply obtained as a result of integration, wherefore all zero-mean signals within the integration range will give a zero contribution. It is noted that simple high-pass filtering may be provided when the impedance Z is checked at the tweeter 2B, and simple low-pass filtering may be provided when the impedance Z is checked at the woofer 2A.

As described above, the method of the disclosure allows use of either sinusoidal or general, i.e., non-sinusoidal test signals.

It will be appreciated that, if general voltage and current signals are used, the only assumption to be provided is that the spectral component of the signals in the relevant band and within the time window $T_m$ is sufficiently high to obtain the signal-to-noise ratio required for measurement. In this case, reference can be made to the sinusoidal voltage and current signals by performing a filtering step with identical passband filters of sufficiently selective power and by imposing an adequate integration window Tm.

In audio applications this means that, for continuous testing during operation of the amplifier, a testing procedure that uses the admittance ratio $G_\chi(\tau)$ can be carried out only when a signal v(t) having a sufficient spectral component in the desired band is actually present for a time longer than Tm. The more selective the filter, the smaller the fraction of filtered signal passing into the admittance ratio $G_\chi(\tau)$. However, a poorly selective filter might allow the passage of signals at such a frequency as to cause the admittance ratio $G_\chi(\tau)$ (or $Z_\chi(\tau)$) value to fall out of the preset error range.

Figure 14:
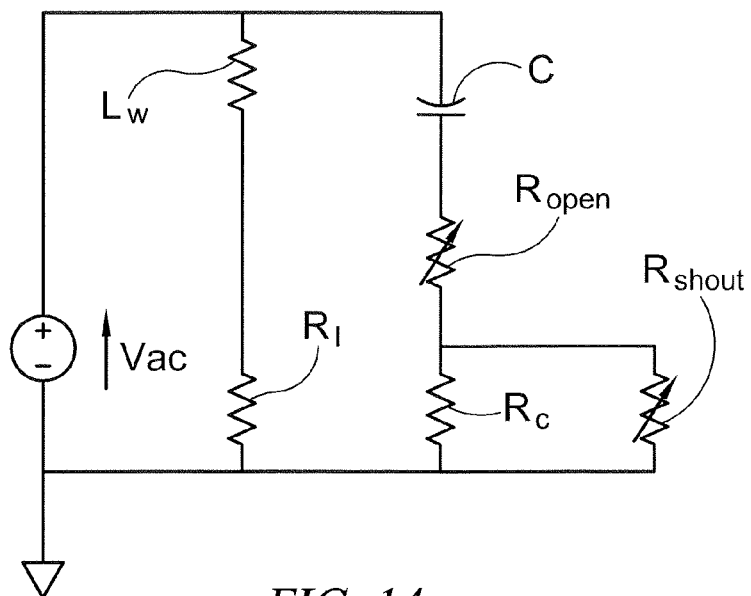
FIG. 14 shows an exemplary wiring diagram of a load that is tested by the method of the present disclosure.

Referring now to the electric network as shown in FIG. 14, a numerical example is shown that can simulate a two-way loudspeaker system as described hereinbefore with reference to FIG. 1. In FIG. 14, the electric network is composed of two impedances connected in parallel with a sinusoidal voltage signal Vac, e.g., at a frequency of 20 kHz, applied thereto. The first impedance is, for example, the series of a 5 mH inductor $L_W$ and a 4 Ohm resistor R1, the second impedance is the series of a 20 uF capacitor c and a 3 Ohm resistor Rc. Now, assume that the resistor of the capacitor-containing branch has to be checked for open/short-circuits, which case exemplifies a testing procedure on the tweeter of a two-way audio system.

When the circuit changes from normal to shorted state ($R_{short}$ tending to zero) the impedance measured at the ends changes from 3 Ohm, phase 7° to 0.39 Ohm phase +90°. $G_\chi(\tau)$ changes from $(1/3)*\cos(7-90)=0.04$ Siemens (25 Ohm) to $(1/0.39)*\cos(90-90)=2.56$ Siemens (0.39 Ohm). While traditional techniques would provide a relative change of 18 db, the inventive method affords a 36 db change of the admittance ratio $G_\chi(\tau)$.

In order to determine the short-circuit threshold, a $G_\chi(\tau)$ value has to be set above which the load is to be deemed in a shorted state.

Still referring to the bipole as shown in FIG. 14 and assuming a frequency of 20 kHz, when changing from normal to open state ($R_{open}$ going to infinity), the impedance measured at the ends changes from 3 Ohm, phase 7° to 600 Ohm, phase -90°. $G_\chi(\tau)$ changes from $(1/3)*\cos(7-7)=0.33$ Siemens (3 Ohm) to $(1/600)*\cos(7+90)=0.0002$ Siemens (4923 Ohm). Relative change: 46 db in modulus, and 64 db for $G_\chi(\tau)$.

In order to determine the open-circuit threshold, an admittance ratio $G_\chi(\tau)$ has to be set below which the load is to be deemed in an open state.

Outlined above are two exemplary cases of implementation of the method of the present disclosure. The detection of changes in load impedance may be optimized by conveniently setting, according to specific cases, the phase shift X to be used in the calculation of the admittance ratio $G_\chi(\tau)$ and by consequently adjusting the thresholds.

For example, for detection of a shorted operating state (or an open operating state), the admittance ratio $G_\chi(\tau)$ may be determined using $\tau$ values that do not necessarily coincide with $\tau_{sh}$ (or $\tau_n$), but the $\tau$ value may be selected around predetermined values, depending on whether the maximum admittance ratio $G_\chi(\tau)$ is desired to be, for example around a certain short (or open) circuit resistance value.

The method may be also used in the case in which a sensor or a transducer is deemed to consist of a variable impedance, wherefore the calculation of $G_\chi(\tau)$ may provide the desired impedance value.

For the purposes hereof and for a better understanding of the formula of admittance ratio $G_\chi(\tau)$, it shall be noted that the main characteristics of this admittance ratio $G_\chi(\tau)$ include the following:

1) In the case of sinusoidal voltage and current, there is a $\tau$ value corresponding to a maximum admittance ratio $G_\chi(\tau)$, and this value corresponds to $\tau=\phi/\omega$, where $\phi$ is the phase shift between general voltage and current.

This law may be mathematically demonstrated.

Given a sinusoidal voltage signal v(t), having a half-amplitude V0, i.e., v(t)=V0 cos(ωt) and given $Z_{nom}=|Z_n|\exp(i\phi)$, then current will be i(t)=I0·cos(ωt+φ), where I0=V0/|Z(ω)| and φ=Arg [Z(ω)].

When these terms are introduced in the formula of the admittance ratio $G_\chi(\tau)$, i.e.:

$$G_\chi(\tau) = \frac{\int_{Tm} v(t) \cdot i(t+\tau) dt}{\int_{Tm} v(t)^2 dt}$$

then:

$$G_\chi(\tau) = \frac{\int_{Tm} \cos(\omega t) \cdot \sin(\omega(t+\tau) - \phi) dt}{|Z(\omega)| * \int_{Tm} \cos^2(\omega t) dt}$$

By calculating the integrals, assuming that Tm is equal to an integer number n of stimulus frequency periods Tm= (n*2π)/ω, then:

$$G_\chi(\tau) = \frac{\cos(\omega\tau - \phi)}{|Z(\omega)|}$$

which has a maximum value as τ changes for (ωτ−φ)=n*2π, i.e., with a maximum argument of cos(ωτ−φ).

2) In the particular case (very frequent in practice, representing a shorted state at the ends of the load), in which the electric network changes from a general impedance state 1 to a purely resistive impedance state 2, we can be certain that the phase shift between current and voltage will tend to zero for any frequency, allowing a short-circuit check with no assumption about the signal transmitted to the network, by simply calculating $G_\chi(0)$.

Now, when testing an electric network, the rule for defining the time value τ to be used to calculate the admittance ratio $G_\chi(\tau)$ will consist in maximizing the change of the admittance ratio $G_\chi(\tau)$ between the normal operating state and the specific abnormal state of the circuit (open or shorted state in one of the network components).

It shall be underlined that there is a time I, a frequency band and a threshold to be imposed to the admittance ratio $G_\chi(\tau)$ depending on the type of abnormal state of the circuit, such as disconnection of the tweeter or short-circuit of the woofer of a two-way audio system.

Figure 13:
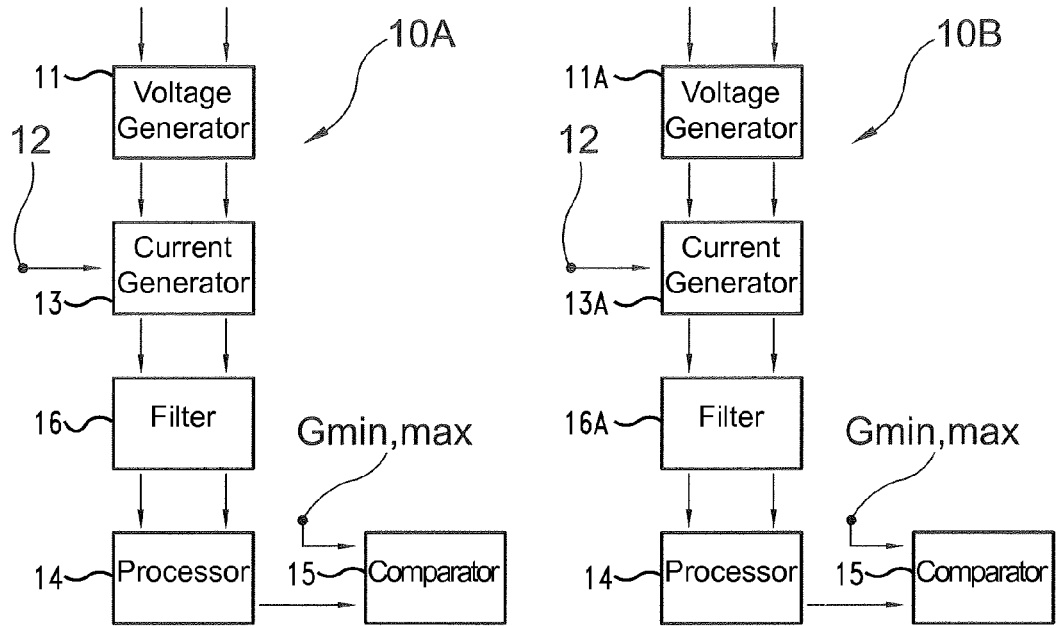
FIG. 13 is a flow chart of the method and corresponding principle block diagram of an apparatus using the method of the present disclosure.

Referring now to FIG. 13, there is shown a block diagram of a voltage 10a or current 10B device that uses the method of the present disclosure. Particularly, the device 10A for testing the operating conditions of the electric network EN includes:

means 11 for:
generating a voltage signal v(t) to be provided to the load L,
measuring the instantaneous current signal i(t) circulating in said load L, and
a selector 12 for selecting the operating state of the load L;
a circuit 13A that generates an instantaneous current signal delayed i(t+τ) by a predetermined amount of time τ as a function of the selected operating state,
a processor 14, operating within a predetermined measurement time Tm, and configured to process an admittance ratio $G_\chi(\tau)$ between:
the mean of the product of the voltage signal v(t) and the delayed instantaneous current signal i(t+τ), and
the mean of the square of the voltage signal v(t),
a comparator 15 that compares the value of the admittance ratio $G_\chi(\tau)$ with a range of predetermined values and thence determine the operating state of the electric network EN.

Advantageously, the device 10A optionally includes a filter 16 for filtering out noise signals in the network EN. Furthermore, the device 10A includes an additional filter (not shown) to filter out non-sinusoidal voltage v(t) and instantaneous current signals i(t).

In one embodiment, the device of the disclosure includes a comparator that compares:
the mean of the product of the voltage signal v(t) and the delayed instantaneous current signal i(t+τ), and
the mean of the square of the voltage signal v(t), multiplied by the range of predetermined values ($G_{min}, G_{max}$),
to determine the operating state of the electric network EN.

As mentioned above, the comparison can be represented as follows:

$G_{min} \cdot \int v(t)^2 dt \leq \int v(t) \cdot i(t+\tau) dt$ $G_{max} \cdot \int v(t)^2 dt \geq \int v(t) \cdot i(t+\tau) dt$ In terms of implementation, this comparison is convenient in that it eliminates dividing calculations, which impose a burden on the computing device.

Similar results can be achieved when the operating condition of the load is tested by transmitting a current signal i(t) and measuring the voltage v(t) at the ends of the load L.

A similar procedure may be carried out using the device 10B (see FIG. 13), which includes:
a circuit 11A for:
generating an instantaneous current signal i(t) to be provided to the load L,
measuring the voltage signal i(t) circulating in said load L, and
a selector 12 that selects the operating state of the load L,
a circuit 13A that generates a voltage signal delayed v(t+τ) by a predetermined amount of time τ as a function of the selected operating state,
a processor 14 operating within a predetermined measurement time Tm, and configured to process an impedance ratio Z(χ) between:
the mean of the product of the current signal i(t) and the delayed voltage signal v(t+τ), and
the mean of the square of the current signal i(t),
a comparator 15 that compares the value of the impedance ratio $Z_\chi(\tau)$ with a range of predetermined values ($Z_{min}, Z_{max}$) and thence determine the operating state of the electric network EN.

Furthermore, the device 10B optionally includes a filter 16A for filtering out noise signals in the network EN. Also, the device 10B includes an additional filter (not shown) to filter out non-sinusoidal instantaneous current i(t) and voltage signals v(t).

Those skilled in the art will obviously appreciate that a number of changes and variants may be made to the arrangements as described hereinbefore to meet specific needs, without departure from the scope of the disclosure, as defined in the following claims.

Particularly, the method for testing the operating condition of the electric network EN may be carried out with reference to the case of a sinusoidal, non sinusoidal, continuous or digital current test signal i(t).

The various embodiments described above can be combined to provide further embodiments. All of the U.S. patents, U.S. patent application publications, U.S. patent applications, foreign patents, foreign patent applications and non-patent publications referred to in this specification and/or listed in the Application Data Sheet are incorporated herein by reference, in their entirety. Aspects of the embodiments can be modified, if necessary to employ concepts of the various patents, applications and publications to provide yet further embodiments.

These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A method for testing operating conditions of an electric network, the operating conditions including an operating state, the electric network having a load, the method comprising:
providing a voltage signal to the load and measuring an instantaneous current signal circulating in the load,
generating a delayed instantaneous current signal delayed by an amount of time by delaying the instantaneous current signal with respect to the voltage signal by the amount of time, the amount of time selected as a function of the operating state of said load,
calculating, within a measurement time, an admittance ratio between a mean of a product of the voltage signal and the delayed instantaneous current signal, and a mean of the square of the voltage signal,
comparing a value of the admittance ratio with a range of admittance values and generating an output signal; and
detecting open-circuit and short-circuit operating states of the electric network based on the output signal.

2. The method of claim 1, wherein if the operating condition is a short-circuit operating state:
the generating the delayed instantaneous current signal comprises delaying the instantaneous current signal by an amount of time that is equal to a short-circuit time value,
the calculating includes calculating the admittance ratio as a short-circuit admittance ratio based on a value of the delayed instantaneous current value, and
the comparing includes comparing the short-circuit admittance ratio with a maximum admittance ratio.

3. The method of claim 1, wherein if the operating condition is an open-circuit operating state:
the generating the delayed instantaneous current signal comprises delaying the instantaneous current signal (i(t)) by an amount of time that is equal to an open-circuit time value,
the calculating includes calculating the admittance ratio as an open-circuit admittance ratio based on the value of the delayed instantaneous current value, and
the comparing includes comparing the open-circuit admittance ratio with a minimum admittance ratio.

4. The method of claim 1, wherein, if the voltage signal (v(t)) and the instantaneous current signal i(t) are analog signals, then the admittance ratio $G_\chi(\tau)$, a short-circuit admittance ratio $G_\chi(\tau_{sh})$, and an open-circuit admittance ratio $G_\chi(\tau_n)$ are determined using the following relations:

$$G_\chi(\tau) = \frac{\int_{Tm} v(t) \cdot i(t+\tau) dt}{\int_{Tm} v(t)^2 dt}$$

$$G_\chi(\tau_{sh}) = \frac{\int_{Tm} v(t) \cdot i(t+\tau_{sh}) dt}{\int_{Tm} v(t)^2 dt}$$

$$G_\chi(\tau_n) = \frac{\int_{Tm} v(t) \cdot i(t+\tau_n) dt}{\int_{Tm} v(t)^2 dt}$$

where (v(t)) is the voltage signal, (i(t+τ)) is the current signal delayed by the amount of time (τ), (i(t+$\tau_{sh}$)) is a first current signal delayed by a first amount of time ($\tau_{sh}$), (i(t+τ)) is a second current signal delayed by a second amount of time ($\tau_n$), and (Tm) is the measurement time.

5. The method of claim 4, wherein the voltage signal (v(t)) and the instantaneous current signal (i(t)) are non-sinusoidal signals, the method comprising filtering the voltage signal (v(t)) and delayed current signal (i(t+τ)) using at least one passband filter.

6. The method of claim 1, wherein, if the voltage signal (v(t)) and the instantaneous current signal (i(t)) are digital signals, then calculating the admittance ratio $G_\chi(\tau)$ includes calculating a digital admittance ratio ($G_\chi(k)$), a short-circuit digital admittance ratio ($G_\chi(k_{sh})$), and an open-circuit digital admittance ratio ($G_\chi(k_n)$) using the following relations:

$$G_\chi(k) = \frac{\sum_m^N v_m \cdot i_{m+k}}{\sum_m^N v_m^2}$$

$$G_\chi(k_{sh}) = \frac{\sum_m^N v_m \cdot i_{m+ksh}}{\sum_m^N v_m^2}$$

$$G_\chi(k_n) = \frac{\sum_m^N v_m \cdot i_{m+kn}}{\sum_m^N v_m^2}$$

where ($v_m$) is an $m^{th}$ sample of the digital voltage signal, (k,$k_{sh}$,$k_n$) are numbers of samples whereby current signal ($i_m$) is to be delayed, ($i_{m+k}$) is an $m^{th}$ sample of the digital instantaneous current signal delayed by an amount of sampling (k), ($i_{m+ksh}$) is an $m^{th}$ sample of the digital instantaneous current signal delayed by the sampling amount ($k_{sh}$), and (N) are the values sampled within the measurement time (Tm).

7. The method of claim 1, comprising filtering said provided voltage signal and said measured instantaneous current signal.

8. The method of claim 1, wherein the calculating includes calculating the admittance ratio ($G_\chi(\tau)$) using the following relation:

$$G_\chi(\tau) = \frac{\int_{Tm} v(t) \cdot i_{real}(t+\tau)dt}{\int_{Tm} v^2(t)dt} + \frac{\int_{Tm} v(t) \cdot i_{noise}(t+\tau)dt}{\int_{Tm} v^2(t)dt}$$

where (v(t)) is the voltage signal, ($i_{real}$(t+τ)) is a current real signal value i(t) delayed by the amount of time (τ), (Tm) is the measurement time, and ($i_{noise}$(t+τ)) is a current noise signal within the electric network.

9. The method of claim 1, wherein the calculating includes calculating the digital admittance ratio ($G_\chi$(k)) using the following relation:

$$G_\chi(k) = \frac{\sum_m^N v_m \cdot i_{real\_m+k}}{\sum_m^N v_m^2} + \frac{\sum_m^N v_m \cdot i_{noise\_m+k}}{\sum_m^N v_m^2}$$

where ($v_m$) is the $m^{th}$ sample of digital voltage signal, ($i_{real\_m+k}$) is the $m^{th}$ sample of digital current real signal ($i_{m+k}$) delayed by amount (k), (N) are the values sampled within the preset measurement time (Tm), and ($i_{noise\_m+k}$) is the $m^{th}$ sample of digital current noise signal within the electric network.

10. The method of claim 1, wherein voltage signal provided to the load is a sinusoidal signal.

11. The method of claim 1, wherein the load is a passive load.

12. A method for testing operating conditions of an electric network, the operating conditions having an operating state, the electric network including a load, the method comprising:
providing an instantaneous current signal (i(t)) to the load and measuring a voltage signal of the load,
generating a delayed voltage that is delayed with respect to the instantaneous current signal by delaying the voltage signal by an amount of time, the amount of time selected as a function of the operating state of the load from one of a first time to detect a short circuit and a second time to detect an open circuit,
calculating, within a measurement time, an impedance ratio value between a mean of a product of the delayed voltage signal and the instantaneous current signal, and a mean of a square of the instantaneous current signal,
comparing the impedance ratio value with a range of impedance ratio values, and
detecting open-circuit and short-circuit operating states of the electric network using the comparison to.

13. The method of claim 12, wherein if the operating condition is a short-circuit operating state (sc):
the generating the delayed voltage signal includes delaying the voltage signal by an amount of time equal to a short-circuit time value to generate a delayed voltage signal,
the calculating includes calculating the impedance ratio value as a short-circuit impedance ratio value based on the value of the delayed voltage signal, and
the comparing includes comparing the short-circuit impedance ratio value with a minimum impedance value.

14. The method of claim 12, wherein if the operating condition is an open-circuit operating state:
the generating the delayed voltage signal comprises delaying the voltage signal by an amount of time equal to an open-circuit time value to generate the delayed voltage signal,
the calculating includes calculating the impedance ratio value as an open-circuit impedance ratio value based on the value of the delayed voltage signal, and
the comparing includes comparing the open-circuit impedance ratio value with a maximum impedance value.

15. The method of claim 12, wherein, if the instantaneous current signal (i(t)) and the voltage signal (v(t)) are analog signals, then the impedance ratio ($Z_\chi$(τ)), a short-circuit impedance ratio ($Z_\chi(\tau_n)$), and an open-circuit impedance ratio ($Z_\chi(\tau_{op})$) are determined using the following relations:

$$Z_\chi(\tau) = \frac{\int_{Tm} v(t+\tau) \cdot i(t)dt}{\int_{Tm} i(t)^2 dt}$$

$$Z_\chi(\tau_n) = \frac{\int_{Tm} v(t+\tau_n) \cdot i(t)dt}{\int_{Tm} i(t)^2 dt}$$

$$Z_\chi(\tau_{op}) = \frac{\int_{Tm} v(t+\tau_{op}) \cdot i(t)dt}{\int_{Tm} i(t)^2 dt}$$

where (v(t+τ)) is the voltage signal delayed by a first amount of time (τ), (v(t+$\tau_n$)) is the first voltage signal delayed by a second amount of time ($\tau_n$), (v(t+$\tau_{op}$)) is the second voltage signal delayed by a third amount of time ($\tau_{op}$), (i(t)) is the instantaneous current signal, and (Tm) is the measurement time.

16. The method of claim 15, wherein the instantaneous current signal (i(t)) and the voltage signal (v(t)) are non-sinusoidal signals, the method including filtering the instantaneous current signal (i(t)) and the delayed voltage signal (v(t+τ)) using at least one passband filter.

17. The method of claim 12, wherein, if the instantaneous current signal (i(t)) and the voltage signal (v(t)) are digital signals, then a digital impedance ratio ($Z_\chi$(k)), a digital short-circuit impedance ratio ($Z_\chi(k_n)$), and a digital open-circuit impedance ratio ($Z_\chi(k_{op})$) are calculated using the following relations:

$$Z_\chi(k) = \frac{\sum_m^N v_{m+k} \cdot i_m}{\sum_m^N i_m^2}$$

$$Z_\chi(k_n) = \frac{\sum_m^N v_{m+kn} \cdot i_m}{\sum_m^N i_m^2}$$

$$Z_\chi(k_{op}) = \frac{\sum_m^N v_{m+kop} \cdot i_m}{\sum_m^N i_m^2}$$

where (k,$k_n$,$k_{op}$) are the numbers of samples whereby the voltage signal ($v_m$) is to be delayed, ($v_{m+k}$) is an $m^{th}$ sample of the digital voltage signal delayed by an amount of sampling (k), ($v_{m+kn}$) is an $m^{th}$ sample of a first digital voltage signal delayed by a second sampling amount ($k_n$), ($v_{m+kop}$) is an $m^{th}$ sample of a second digital voltage signal delayed by a third amount of sampling ($k_{op}$), ($i_m$) is an $m^{thl}$ sample of the digital instantaneous current signal, and (N) are the values sampled within the measurement time (Tm).

18. The method of claim 12, the method including filtering the provided instantaneous current signal and the measured voltage signal.

19. The method of claim 12, wherein the calculating includes calculating the impedance ratio ($Z_\chi(\tau)$) using the following relation:

$$Z_\chi(\tau) = \frac{\int_{Tm} v_{real}(t+\tau) \cdot i(t) dt}{\int_{Tm} i^2(t) dt} + \frac{\int_{Tm} v_{noise}(t+\tau) \cdot i(t) dt}{\int_{Tm} i^2(t) dt}$$

where ($v_{real}(t+\tau)$) is a voltage real signal delayed by the time ($\tau$), (i(t)) is the instantaneous current signal i(t), (Tm) is the measurement time, and ($v_{noise}(t+\tau)$) is a voltage noise signal within the electric network.

20. The method of claim 12, wherein the calculating includes calculating the digital impedance ratio using the following relation:

$$Z_\chi(k) = \frac{\sum_m^N v_{real\_m+k} \cdot i_m}{\sum_m^N i_m^2} + \frac{\sum_m^N v_{noise\_m+k} \cdot i_m}{\sum_m^N i_m^2}$$

where ($v_{real\_m+k}$) is an $m^{th}$ sample of the digital voltage real signal ($v_{m+k}$) delayed by the amount (k), ($i_m$) is an $m^{th}$ sample of the digital instantaneous current signal, (N) are the values sampled within the measurement time (Tm), and ($v_{noise\_m+k}$) is an $m^{th}$ sample of the digital voltage noise signal within the electric network.

21. The method of claim 12, wherein the instantaneous current signal provided to the load is a sinusoidal signal.

22. A device for testing operating conditions of an electric network having a load, the conditions including an operating state, the device comprising:
a circuit structured to generate a voltage signal to be provided to the load and to measure an instantaneous current signal circulating in the load;
a selector structured to select an amount of time as a function of the operating state to be tested in the load,
a circuit structured to generate a delayed instantaneous current signal delayed with respect to the voltage signal by the amount of time that is selected as a function of the operating state of the load;
a processor structured to operate within a measurement time and configured to calculate an admittance ratio between a mean of a product of the voltage signal and the delayed instantaneous current signal, and a mean of a square of the voltage signal; and
a comparator structured to compare a value of the admittance ratio with a range of admittance values and to generate an output signal to the processor that is structured to detect open-circuit and short-circuit operating states of the electric network.

23. The device for testing the operating conditions of the electric network of claim 22, comprising a filter structured to filter out signal noises in the electric network.

24. A device for testing operating conditions of an electric network, including an operating state, the electric network having a load, the device comprising:

a circuit structured to generate an instantaneous current signal to be provided to the load and measuring a voltage signal at the ends of the load;
a selector structured to select the operating state of the load;
a generator structured to generate a delayed voltage signal that is delayed with respect to the instantaneous current signal by an amount of time that is selected as a function of the operating state of the load;
a processor structured to calculate, within a measurement time, an impedance ratio between a mean of a product of the delayed voltage signal and the instantaneous current signal, and a mean of a square of the instantaneous current signal; and
a comparator structured to compare a value of the impedance ratio with a range of impedance values and to generate an output signal to the processor, the processor further structured to detect open-circuit and short-circuit operating states of the electric network.

25. The device for testing the operating conditions of an electric network of claim 24, comprising a filter structured to filter out signal noises in the electric network.

26. A method, comprising:
providing a voltage signal to an electric network having an operating state, the electric network including a load;
measuring a resulting instantaneous current signal circulating in the load;
generating a delayed instantaneous current signal that is delayed with respect to the voltage signal by an amount of time selected as a function of an operating state of the load;
calculating within a measurement time an admittance ratio; and
comparing a value of the admittance ratio with a range of admittance values to detect open-circuit and short-circuit operating states of the electric network.

27. The method of claim 26, wherein calculating the admittance ratio includes calculating the admittance ratio between a mean of a product of the voltage signal and the delayed instantaneous current signal, and a mean of a square of the voltage signal.

28. The method of claim 27, wherein if the operating condition of the electric network is a short-circuit operating state, the method includes delaying the instantaneous current signal by an amount of time equal to a short-circuit time value to generate a first delayed instantaneous current signal, calculating the admittance ratio based on a value of the delayed instantaneous current value to generate a short-circuit admittance ratio, and comparing the short-circuit admittance ratio with an admittance value; and
if the operating condition is an open-circuit operating state, the method further includes calculating an impedance ratio by delaying the instantaneous current signal by an amount of time equal to an open-circuit time value to generate a second delayed instantaneous current signal, calculating the impedance ratio based on the value of the second delayed instantaneous current value to generate an open-circuit impedance ratio, and comparing the open-circuit impedance ratio with an impedance value.

29. A circuit for testing operating conditions of an electric network having an operating state and coupled to a load, the circuit comprising:
a first circuit adapted to generate a voltage signal to be provided to the load and to measure an instantaneous current signal circulating in the load as a result of the generating of the voltage signal;
a selector circuit adapted to select an amount of time;

a second circuit adapted to generate a delayed instantaneous current signal that is delayed with respect to the voltage signal by the amount of time selected by the selector;

a processor operating within a measurement time and adapted to process an admittance ratio within a measurement time; and a comparator adapted to compare the value of the admittance ratio with a range of values and generating an output signal to the processor that is further structured to detect open-circuit and short-circuit operating states of the electric network.

30. The circuit of claim 29, wherein the selector is adapted to select the amount of time as a function of the at least one operating state to be tested of the electric network, and the second circuit is adapted to generate the instantaneous current signal by the amount of time as a function of the operating state selected by the selector.

31. The circuit of claim 30, wherein the processor is configured to process the admittance ratio between a mean of a product of the voltage signal generated by the first circuit and the delayed instantaneous current signal generated by the second circuit and a mean of a square of the voltage signal generated by the first circuit.

* * * * *

UNITED STATES PATENT AND TRADEMARK OFFICE
CERTIFICATE OF CORRECTION

PATENT NO. : 8,483,984 B2
APPLICATION NO. : 12/389173
DATED : July 9, 2013
INVENTOR(S) : Giovanni Gonano It is certified that error appears in the above-identified patent and that said Letters Patent is hereby corrected as shown below:

In the Claims

Column 16, Lines 33-53:

$$G\chi(k) = \frac{\sum_{m}^{N} v_m \cdot i_{m+k}}{\sum_{m}^{N} v^2_m}$$

$$G\chi(k_{sh}) = \frac{\sum_{m}^{N} v_m \cdot i_{m+ksh}}{\sum_{m}^{N} v^2_m}$$

$$G\chi(k_n) = \frac{\sum_{m}^{N} v_m \cdot i_{m+kn}}{\sum_{m}^{N} v^2_m}$$

" "

should read,

Signed and Sealed this
Fifteenth Day of April, 2014

Michelle K. Lee
*Deputy Director of the United States Patent and Trademark Office*

Column 16, Lines 33-53 (Continued):

$$G\chi(k) = \frac{\sum_{m}^{N} v_m \cdot i_{m+k}}{\sum_{m}^{N} v_m^2}$$

$$G\chi(k_{sh}) = \frac{\sum_{m}^{N} v_m \cdot i_{m+ksh}}{\sum_{m}^{N} v_m^2}$$

$$G\chi(k_n) = \frac{\sum_{m}^{N} v_m \cdot i_{m+kn}}{\sum_{m}^{N} v_m^2}$$

-- --.

Column 17, Lines 14-21:

"$$G\chi = \frac{\sum_{m}^{N} v_m i_{real\_m+k}}{\sum_{m}^{N} v^2_m} + \frac{\sum_{m}^{N} v_m i_{noise\_m+k}}{\sum_{m}^{N} v^2_m}$$"

should read, $$G\chi(k) = \frac{\sum_{m}^{N} v_m i_{real\_m+k}}{\sum_{m}^{N} v_m^2} + \frac{\sum_{m}^{N} v_m i_{noise\_m+k}}{\sum_{m}^{N} v_m^2}$$

-- --.

Column 12, Line 51:
"the electric network using the comparison to." should read, --the electric networking using the comparison--.

CERTIFICATE OF CORRECTION (continued)
U.S. Pat. No. 8,483,984 B2

Column 18, Lines 43-61:

$$Z\chi(k) = \frac{\sum_m^N v_{m+k} \cdot i_m}{\sum_m^N i^2_m}$$

$$Z\chi(k_n) = \frac{\sum_m^N v_{m+kn} \cdot i_m}{\sum_m^N i^2_m}$$

$$Z\chi(k_{op}) = \frac{\sum_m^N v_{m+kop} \cdot i_m}{\sum_m^N i^2_m}$$

" " should read, $$Z\chi(k) = \frac{\sum_m^N v_{m+k} \cdot i_m}{\sum_m^N i_m^2}$$

$$Z\chi(k_n) = \frac{\sum_m^N v_{m+kn} \cdot i_m}{\sum_m^N i_m^2}$$

$$Z\chi(k_{op}) = \frac{\sum_m^N v_{m+kop} \cdot i_m}{\sum_m^N i_m^2}$$

-- --.

Column 19, Line 1:
"third amount of sampling ($k_{op}$), ($i_m$) is an $m^{thl}$ sample of the" should read, --third amount of sampling ($k_{op}$), ($i_m$) is an $m^{th}$ sample of the--.

CERTIFICATE OF CORRECTION (continued)
U.S. Pat. No. 8,483,984 B2

Column 19, Lines 24-31:

"
$$Z\chi(k) = \frac{\sum_{m}^{N} v_{real\_m+k} \cdot i_m}{\sum_{m}^{N} i^2_m} + \frac{\sum_{m}^{N} v_{noise\_m+k} \cdot i_m}{\sum_{m}^{N} i^2_m}$$
"

should read, $$Z\chi(k) = \frac{\sum_{m}^{N} v_{real\_m+k} \cdot i_m}{\sum_{m}^{N} i_m^2} + \frac{\sum_{m}^{N} v_{noise\_m+k} \cdot i_m}{\sum_{m}^{N} i_m^2}$$

--.